(12) United States Patent
Kumar et al.

(10) Patent No.: US 10,671,782 B2
(45) Date of Patent: Jun. 2, 2020

(54) ARCHITECTURE FOR ORDERED WRITE OF DATA COLLECTED IN PARALLEL

(71) Applicant: International Business Machines Corporation, Armonk, NY (US)

(72) Inventors: Maurya Prabhat Kumar, Bangalore (IN); SheshaShayee K Raghunathan, Karnataka (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/173,344

(22) Filed: Oct. 29, 2018

(65) Prior Publication Data

US 2020/0134115 A1    Apr. 30, 2020

(51) Int. Cl.
  *G06F 30/3312*    (2020.01)
  *G06F 16/18*    (2019.01)
  *G06F 30/394*    (2020.01)
  *G06F 30/3323*    (2020.01)

(52) U.S. Cl.
  CPC ...... *G06F 30/3312* (2020.01); *G06F 16/1858* (2019.01); *G06F 30/3323* (2020.01); *G06F 30/394* (2020.01)

(58) Field of Classification Search
  CPC ............. G06F 17/5031; G06F 16/1858; G06F 17/504; G06F 17/5077
  USPC ........................................................ 716/113
  See application file for complete search history.

(56) References Cited

U.S. PATENT DOCUMENTS

| 7,793,243 B1* | 9/2010 | Becer .................. G06F 17/5031 716/108 |
| 8,028,260 B1 | 9/2011 | Ravi |
| 8,079,004 B2 | 12/2011 | Soviani et al. |
| 8,261,220 B2 | 9/2012 | Wu et al. |
| 8,341,577 B1* | 12/2012 | Korobkov ........... G06F 17/5036 703/19 |
| 8,381,150 B2 | 2/2013 | Zolotov et al. |
| 8,627,250 B2 | 1/2014 | Maor et al. |
| 8,775,988 B2 | 7/2014 | Lavin et al. |
| 9,875,333 B1 | 1/2018 | Verma et al. |

(Continued)

FOREIGN PATENT DOCUMENTS

WO    WO-2008153667 A2 *  12/2008  ......... G06F 17/5031

*Primary Examiner* — Suresh Memula
(74) *Attorney, Agent, or Firm* — Cantor Colburn LLP; Steven Meyers

(57) ABSTRACT

A system and method to perform an ordered write of timing analysis data obtained in parallel during integrated circuit development process two or more data sets with two or more processors in parallel. The two or more data sets result from timing analysis and correspond with two or more paths, each path includes a set of interconnected components, and the processing includes collecting and formatting information to obtain the timing analysis data associated with each of the two or more paths. The method includes determining a next timing analysis data using an ordered list of the two or more data sets that correspond with the timing analysis data, consulting an availability vector to determine whether the next timing analysis data is available, and writing the next timing analysis data as soon as it is available prior to completion of the processing of others of the two or more data sets.

20 Claims, 4 Drawing Sheets

(56) References Cited

U.S. PATENT DOCUMENTS

| | | | |
|---|---|---|---|
| 2012/0066656 A1* | 3/2012 | Sripada | G06F 17/504 716/108 |
| 2012/0159414 A1* | 6/2012 | Ghanta | G06F 17/5031 716/113 |
| 2012/0221313 A1* | 8/2012 | Patra | G06F 17/5031 703/19 |
| 2012/0311515 A1* | 12/2012 | Zolotov | G06F 8/20 716/108 |

* cited by examiner

ARCHITECTURE FOR ORDERED WRITE OF DATA COLLECTED IN PARALLEL

BACKGROUND

The present invention relates to data collection and reporting, and more specifically, to an architecture for an ordered write of data collected in parallel.

Parallel processing (i.e., the processing of multiple threads concurrently) can result in a reduction in the time it takes to collect data. The processing of each thread can require a different duration of time. Thus, the completion of the processing of some threads can precede the completion of processing of other threads. When the data that is obtained from all of the threads must be written in a particular order, the time saved by performing the processing in parallel can be undercut by the time it takes to ensure that processing of all the threads is completed such that data can be written in the proper order.

SUMMARY

Embodiments of the present invention are directed to systems and methods to perform an ordered write of timing analysis data obtained in parallel during integrated circuit development. The method includes processing two or more data sets with two or more processors in parallel. The two or more data sets result from timing analysis and correspond with two or more paths in an integrated circuit, each path includes a set of interconnected components, and the processing includes collecting and formatting information from each of the two or more data sets to obtain the timing analysis data associated with each of the two or more paths. The method also includes determining a next timing analysis data among the timing analysis data obtained by the processing using an ordered list of the two or more data sets that correspond with the timing analysis data, consulting an availability vector indicating availability of the timing analysis data associated with each of the two or more data sets to determine whether the next timing analysis data is available, and writing the next timing analysis data as soon as it is available according to the availability vector prior to completion of the processing of others of the two or more data sets.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

DETAILED DESCRIPTION

Figure 1:
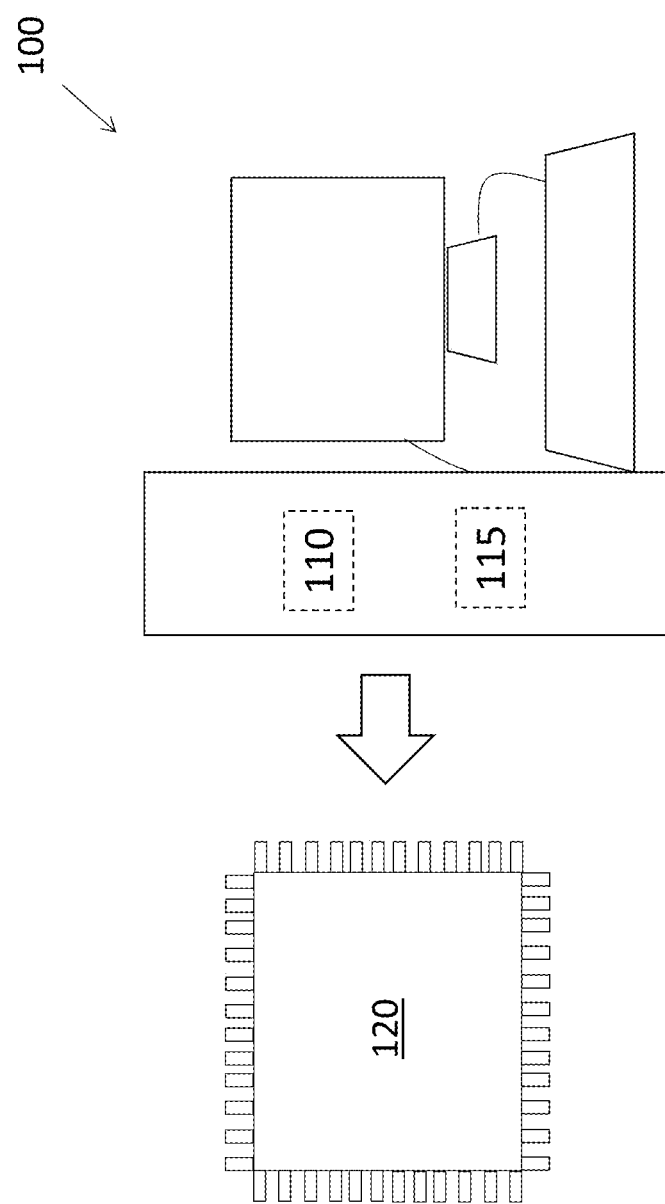
FIG. 1 is a block diagram of a system to perform integrated circuit design and an ordered write of data collected in parallel according to one or more embodiments of the invention.

As previously noted, parallel processing of threads to obtain data that must be written in a particular order can present challenges. Previously, serial processing, which is more time-consuming than parallel processing, was used to avoid the potential for data being written out of order. Embodiments of the systems and methods detailed herein relate to an architecture for an ordered write of data collected in parallel. Parallel processing is used to obtain data sets, and a status vector is used to ensure that the next data set in the predefined order is written as soon as it is available (i.e., as soon as the processing of the associated thread is completed). An exemplary application is detailed herein, but the embodiments detailed can be used in other scenarios, as well.

Integrated circuit development involves several phases such as logic design, logic synthesis, and physical synthesis to finalize a design that is ultimately fabricated into the integrated circuit (i.e., chip). Timing analysis is performed at different phases, sometimes iteratively, to ensure that the final design meets all timing requirements in addition to functional and power requirements. The integrated circuit can be subdivided into different hierarchical levels (e.g., cores that include units that each include macros), and timing analysis can be performed at any hierarchical level, as well as at different levels of detail. The components (e.g., logic elements, storage elements, latches) of the integrated circuit can be referred to as nodes, and, at a given hierarchical level, signals propagate from input nodes through other nodes of the hierarchical level to output nodes. Each set of nodes from an input node to an output node defines a path.

Generally, the timing analysis for a given path involves beginning with the arrival time of a signal at the input node and adding the delay associated with that input node and with the edge (which represents a wire) that connects that input node with the next node in the path to obtain the arrival time at that next node. In this manner, arrival time can be computed for one node to the next in the path until the output node is reached. At a given node, timing tests can be conducted using the arrival time. For example, for a node that is a storage element, the arrival time can be compared with the required arrival time (RAT), which ensures that the data signal arrives at the storage element early enough for valid gating but not so early as to cause premature gating. When the arrival time precedes the RAT, the associated node is said to have positive slack, while an arrival time after the RAT is referred to as negative slack.

Slack indicates which paths of a given hierarchical level meet or exceed timing requirements and which paths fail the timing requirements. Thus, slack is a useful metric in identifying paths or areas of the integrated circuit that require redesign or another approach to improve timing performance. Path-based analysis reporting is the reporting of information about different paths within a hierarchical level of interest in an order that is determined by the slack associated with each path. For example, information about the paths with the highest negative slack (i.e., the paths that require the most improvement in timing) can be reported before information about the paths with the highest positive slack.

Writing the report includes obtaining timing data for each node (i.e., pin) of the path and formatting the data. This processing can be done in parallel for each path. For example, three processing threads can process three paths at a time. However, the slack-based path order that is indicated prior to this processing must be used to write the data associated with each path in the proper order. Previously, processing by all the threads was completed such that all the paths were processed and ready for the write operation in order to ensure that the report was written in the proper order. Because the processing by each of the threads represents the most time-consuming aspect of the timing report generation, this approach results in an inefficiency in the report generation. Another approach used synchronization locks. The architecture according to one or more embodiments of the invention facilitates the path-based analysis reporting, as detailed herein, without requiring synchronization locks. As previously noted, the architecture according to one or more embodiments of the invention can also be applied to other scenarios that require an ordered writing of data that is obtained through parallel processing. The write function is performed serially with respect to data sets but is performed in parallel with the processing of the data sets.

FIG. 1 is a block diagram of a system 100 to perform integrated circuit design and an ordered write of data collected in parallel according to one or more embodiments of the invention. The system 100 includes processing circuitry 110 and memory 115 that is used to generate the design that is ultimately fabricated into an integrated circuit 120. The system 100 also implements the architecture to perform the ordered write, as detailed herein. Once the integrated circuit design is finalized, the steps involved in the fabrication of the integrated circuit 120 are well-known and only briefly described herein and with reference to FIG. 4. The physical layout is finalized, in part, based on the SADP-aware routing according to embodiments of the invention. The finalized physical layout is provided to a foundry. Masks are generated for each layer of the integrated circuit 120 based on the finalized physical layout. Then, the wafer is processed in the sequence of the mask order. The processing includes photolithography and etch. The fabrication is further discussed with reference to FIG. 4.

Figure 2:
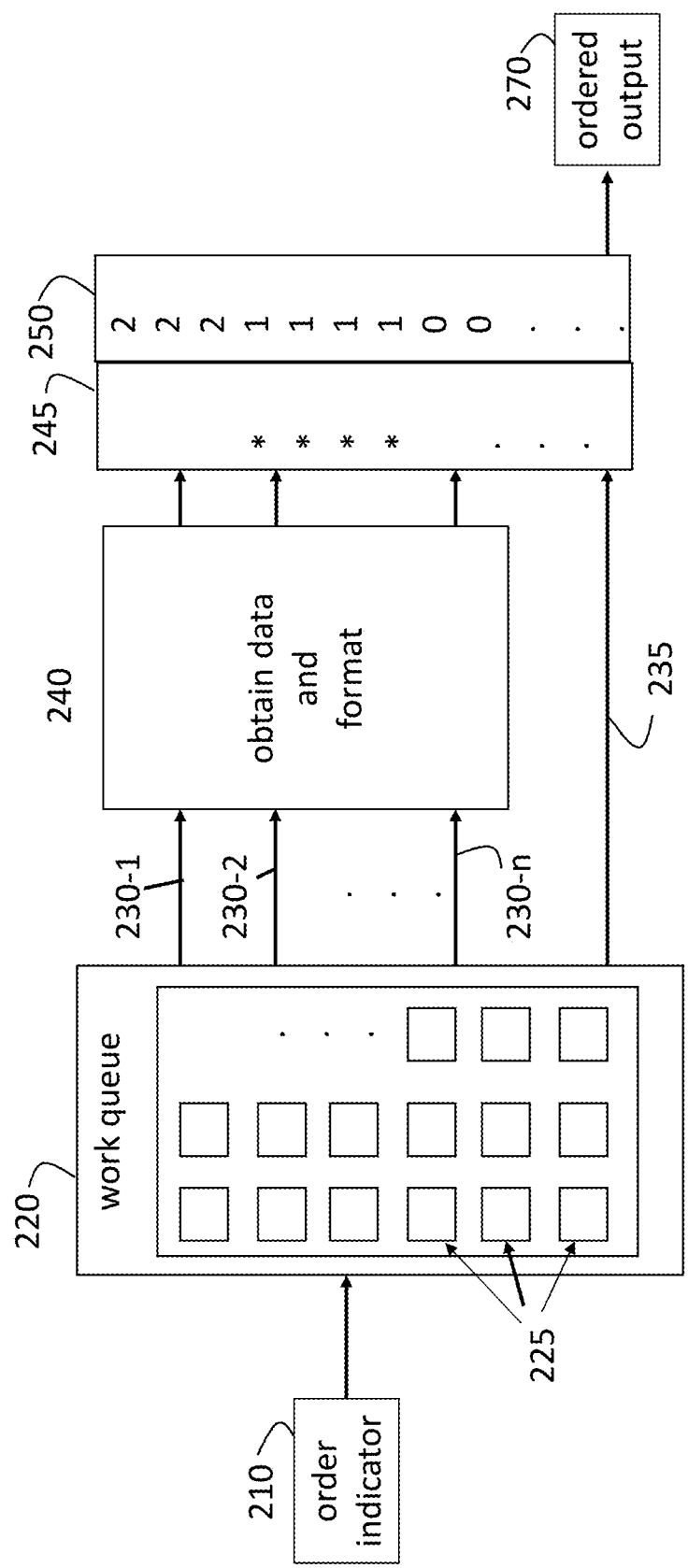
FIG. 2 is a block diagram of the architecture used to perform an ordered write of data collected in parallel according to one or more embodiments of the invention.

FIG. 2 is a block diagram of the architecture used to perform an ordered write of data collected in parallel according to one or more embodiments of the invention. At block 210, an order indicator specifies the desired order for the write. In the case of the path-based analysis reporting, the order indicator, at block 210, specifies the slack-based order in which timing analysis information for each path should be reported. The work queue, at block 220, includes the individual data sets 225 that must be processed and written in the specified order. In the exemplary case, the individual data sets 225 include timing data for each pin or node within a path.

Parallel processing via multiple threads 230-1 through 230-n (generally referred to as 230) results in obtaining data and formatting, at block 240. The multiple threads 230 can be implemented by multiple processors of the processing circuitry 110 processing data sets 225 stored in one or more memory devices comprising the memory 115 of the system 100. In alternate embodiments, the multiple threads 230 can be implemented by processing circuitry 110 of multiple systems 100 in communication with each other. The workgroup size specifies the number of data sets 225 that are assigned to each thread 230 at a time. The workgroup size can be optimized and adjusted, like the number of threads 230. In the exemplary case of the data pertaining to timing analysis, the individual data sets 225 are timing data for individual paths. Thus, each thread 230 processes one or more paths in turn and obtains timing data for each node in the path. The processing includes formatting the timing data, as needed, to generate the path-based analysis report. As previously noted, the different threads 230 can complete the processing at different times. Thus, according to one or more embodiments of the invention, a data status vector 250 is maintained.

A data string vector 245 has the same number of entries as the number of data sets 225 (e.g., number of individual paths with timing data) in the work queue. The data string vector 245 indicates (e.g., with the "*" as in FIG. 2 or with a pointer to the formatted data string) when a formatted data string has been obtained, at block 240, such that write processing can begin. The data string vector 245 can be updated by the thread 230 that processed the path according to an exemplary embodiment of the invention. The status of the write processing is indicated by the data status vector 250. The data status vector 250 also includes one entry per data set 225 (e.g., timing data for an individual path) in the work queue. According to an exemplary embodiment, a value of 0 in the data status vector 250 indicates that the corresponding data set 225 has not been processed by a thread 230. Thus, the initial value for all entries in the data status vector 250 can be 0. A value of 1 indicates that processing of the corresponding data set 225 is completed and the data (e.g., timing data) is ready to write. A value of 2 indicates that the write is complete for the corresponding data set 225. Thus, according to an exemplary embodiment of the invention, the thread 230 that processed the path can update the corresponding value in the data status vector 250 from 0 to 1 in addition to updating the data string vector 245.

A writer thread 235 performs the write of the data obtained and formatted, at block 240, to generate the ordered output 270. The writer thread uses the order indicator 210 to determine the next processed data set 225 to write. That is, for the exemplary timing analysis case, the order indicator 210 indicates the next path for which timing data should be written into the path-based analysis report as the ordered output 270. Rather than waiting for all the threads 230 to complete processing of their associated data sets 225 (paths), the writer thread 235 can use the data status vector 250 to determine if the processed and formatted data is ready. That is, if the data status vector 250 has a "1" in the position corresponding with the next path, then the writer thread 235 can write the formatted data into the path-based analysis report as the ordered output 270. While the entry corresponding to the data set 225 (path) in the data status vector 250 is changed from 0 to 1 while the writer thread 235 is preparing the write (i.e., after the data string vector 245 has the indication that the thread 230 has completed processing), the entry is then changed from 1 to 2 during the write. According to an exemplary embodiment of the invention, the writer thread 235 can change the status in the data status vector 250 from "1" to "2." In addition, the writer thread 235 can delete the formatted data (e.g., from the memory location indicated by the pointer in the data string vector 245) following the write operation. In this way, usage of memory 115 can be made more efficient. As noted, the indicator (e.g., "1") in the data status vector 250 facilitates commencing the write as soon as the next data set 225, according to the order indicated by the order indicator 210, is ready to write rather than waiting for all the threads 230 to complete processing. By facilitating the serial write function in parallel with the processing by the threads 230, the architecture according to one or more embodiments of the invention improves the data processing and storage technology.

Figure 3:
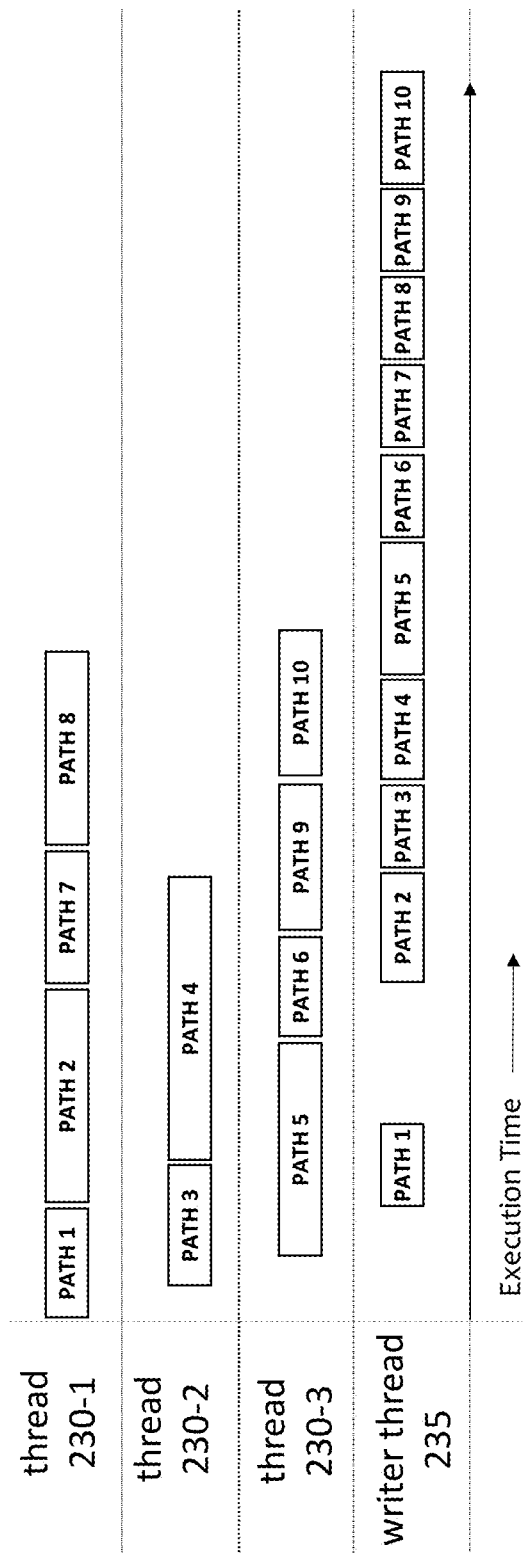
FIG. 3 illustrates the execution time for writing a path-based analysis report using an architecture for an ordered write of data collected in parallel according to one or more embodiments of the invention.

FIG. 3 illustrates the execution time for writing a path-based analysis report using an architecture for an ordered write of data collected in parallel according to one or more embodiments of the invention. In the example, ten paths are ordered from PATH 1 to PATH 10, as indicated by the order indicator 210, and the workgroup size is two such that each thread 230 is assigned two paths for processing at a time. Thus, thread 230-1 is assigned PATH 1 and PATH 2, thread 230-2 is assigned PATH 3 and PATH 4, and thread 230-3 is assigned PATH 5 and PATH 6. The thread 230-1 is assigned the next two paths, PATH 7 and PATH 8. Because thread 230-3 completes processing of PATH 5 and PATH 6 before thread 230-2 completes processing of PATH 3 and PATH 4, thread 230-3 is assigned the remaining two paths, PATH 9 and PATH 10. As FIG. 3 indicates, some data sets 225 can take longer to process than others. For example, the processing of PATH 4 requires more execution time than the processing of PATH 6. As previously noted, the workgroup size can be optimized or adjusted, as needed, to ultimately minimize the wait time of the writer thread 235. The processing of each path by each thread 230 involves obtaining and formatting the timing data for the path, at block 240.

According to the architecture discussed with reference to FIG. 2, the writer thread 235 writes the processed data for each data set 225 (path) serially but performs the write operation in parallel with the processing by the threads 230. Thus, as soon as PATH 1 is processed by thread 230-1, the data string indicator entry associated with PATH 1 would indicate "*" and the writer thread 235 could commence the writing process without waiting for other threads 230 to complete processing. This is indicated by the execution time in FIG. 3. As also indicated, after the writer thread 235 completes the write for PATH 1, it must wait for the processing of PATH 2, by thread 230-1, to be completed before writing the timing data for PATH 2. However, because PATH 3 processing, by thread 230-2, is completed even before the processing of PATH 2, by thread 230-1, the timing data for PATH 3 can be written, by the writer thread 235, as soon as the write for PATH 2 is completed. As FIG. 3 indicates, wait times are minimized based on the fact that timing data for the next path, according to the order indicator 210, can be written as soon as its processing by a thread 230 is complete without waiting for any other thread 230 to complete processing. Thus, in the exemplary application, the architecture according to one or more embodiments of the invention improves timing analysis as part of integrated circuit development.

Figure 4:
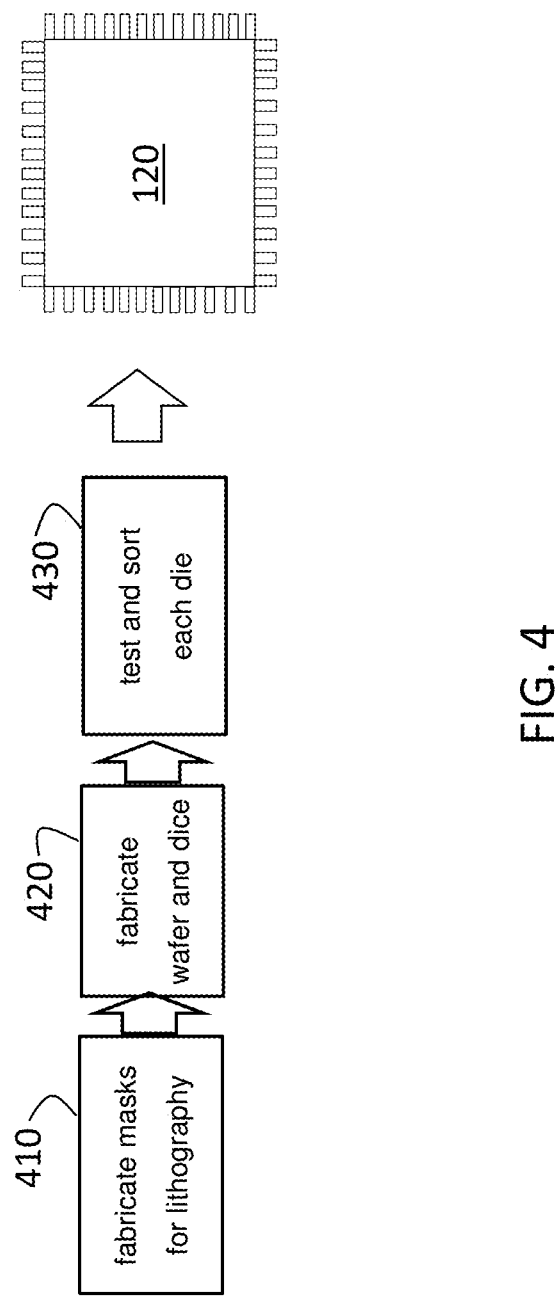
FIG. 4 is a process flow of a method of fabricating the integrated circuit design that is finalized using the ordered write of a path-based analysis report according to one or more embodiments of the invention.

FIG. 4 is a process flow of a method of fabricating the integrated circuit 120 design that is finalized using the ordered write of a path-based analysis report according to one or more embodiments of the invention. Once the physical design data is obtained, based, in part, on performing self-aligned double patterning-aware routing according to one or more embodiments of the invention, the processes shown in FIG. 4 can be performed to fabricate the integrated circuit 120. Generally, a wafer with multiple copies of the final design is fabricated and cut (i.e., diced) such that each die is one copy of the integrated circuit 120. At block 410, the processes include fabricating masks for lithography based on the finalized physical layout. At block 420, fabricating the wafer includes using the masks to perform photolithography and etching. Once the wafer is diced, testing and sorting each die is performed, at block 430, to filter out any faulty die.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method of performing an ordered write of timing analysis data obtained in parallel during integrated circuit development, the method comprising:
   processing two or more data sets with two or more processors in parallel, wherein the two or more data sets result from timing analysis and correspond with two or more paths in an integrated circuit, each path includes a set of interconnected components, and the processing includes collecting and formatting information from each of the two or more data sets to obtain the timing analysis data associated with each of the two or more paths;
   determining a next timing analysis data among the timing analysis data obtained by the processing using an ordered list of the two or more data sets that correspond with the timing analysis data;
   consulting an availability vector indicating availability of the timing analysis data associated with each of the two or more data sets to determine whether the next timing analysis data is available; and writing the next timing analysis data as soon as it is available according to the availability vector prior to completion of the processing of others of the two or more data sets.

2. The computer-implemented method according to claim 1, further comprising assigning a number of the two or more data sets to each of the two or more processors based on the number being a predefined workgroup size.

3. The computer-implemented method according to claim 2, further comprising changing the predefined workgroup size.

4. The computer-implemented method according to claim 1, further comprising updating the availability vector following completion of the processing of any of the two or more data sets, wherein the availability vector includes an entry associated with each of the two or more data sets.

5. The computer-implemented method according to claim 1, further comprising maintaining a write status vector with an entry associated with each of the two or more data sets, wherein the write status vector is updated as each corresponding timing analysis data is prepared for the writing and as the writing is completed.

6. The computer-implemented method according to claim 1, wherein the collecting and formatting information from each of the two or more data sets to obtain the timing analysis data includes obtaining timing data at an input pin and output pin of each component among the set of interconnected components of the corresponding path among the two or more paths.

7. The computer-implemented method according to claim 1, further comprising providing a final integrated circuit design for fabrication following the timing analysis.

8. A system to perform an ordered write of timing analysis data obtained in parallel during integrated circuit development, the system comprising:
a memory device configured to store two or more data sets resulting from timing analysis of an integrated circuit and corresponding with two or more paths in the integrated circuit, each path including a set of interconnected components;
two or more processors configured to process the two or more data sets in parallel, wherein the processing includes collecting and formatting information from each of the two or more data sets to obtain the timing analysis data associated with each of the two or more paths; and
a write processor configured to determine a next timing analysis data among the timing analysis data obtained by the processing using an ordered list of the two or more data sets that correspond with the timing analysis data, to determine whether the next timing analysis data is available by consulting an availability vector indicating availability of the timing analysis data associated with each of the two or more data sets, and to write the next timing analysis data as soon as it is available according to the availability vector prior to completion of the processing of others of the two or more data sets.

9. The system according to claim 8, wherein each of the two or more processors is assigned a number of the two or more data sets to each of the two or more processors based on the number being a predefined workgroup size.

10. The system according to claim 8, wherein one of the two or more processors updates the availability vector following completion of processing of any of the two or more data sets, wherein the availability vector includes an entry associated with each of the two or more data sets.

11. The system according to claim 8, wherein the write processor maintains a write status vector with an entry associated with each of the two or more data sets and is further configured to update the write status vector as each corresponding timing analysis data is written.

12. The system according to claim 8, wherein the timing analysis data includes timing data at an input pin and output pin of each component among the set of interconnected components of the corresponding path among the two or more paths.

13. The system according to claim 8, wherein a final integrated circuit design is provided for fabrication following the timing analysis.

14. A computer program product for performing an ordered write of timing analysis data obtained in parallel during integrated circuit development, the computer program product comprising a non-transitory computer readable storage medium having program instructions embodied therewith, the program instructions executable by a processor to perform a method comprising:
processing two or more data sets with two or more processors in parallel, wherein the two or more data sets result from timing analysis of an integrated circuit and correspond with two or more paths in the integrated circuit, each path includes a set of interconnected components, and the processing includes collecting and formatting information from each of the two or more data sets to obtain the timing analysis data associated with each of the two or more paths;
determining a next timing analysis data among the timing analysis data obtained by the processing using an ordered list of the two or more data sets that correspond with the timing analysis data;
consulting an availability vector indicating availability of the timing analysis data associated with each of the two or more data sets to determine whether the next timing analysis data is available; and
writing the next timing analysis data as soon as it is available according to the availability vector prior to completion of the processing of others of the two or more data sets.

15. The computer program product according to claim 14, further comprising assigning a number of the two or more data sets to each of the two or more processors based on the number being a predefined workgroup size.

16. The computer program product according to claim 15, further comprising changing the predefined workgroup size.

17. The computer program product according to claim 14, further comprising updating the availability vector following completion of the processing of any of the two or more data sets, wherein the availability vector includes an entry associated with each of the two or more data sets.

18. The computer program product according to claim 14, further comprising maintaining a write status vector with an entry associated with each of the two or more data sets, wherein the write status vector is updated as each corresponding timing analysis data is prepared for the writing and as the writing is completed.

19. The computer program product according to claim 14, wherein the collecting and formatting information from each of the two or more data sets to obtain the timing analysis data includes obtaining timing data at an input pin and output pin of each component among the set of interconnected components of the corresponding path among the two or more paths.

20. The computer program product according to claim 14, further comprising providing a final integrated circuit design for fabrication following the timing analysis.

* * * * *